United States Patent
Lam

(10) Patent No.: US 6,344,401 B1
(45) Date of Patent: Feb. 5, 2002

(54) METHOD OF FORMING A STACKED-DIE INTEGRATED CIRCUIT CHIP PACKAGE ON A WATER LEVEL

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/521,299

(22) Filed: Mar. 9, 2000

(51) Int. Cl.$^7$ .................. H01L 21/301; H01L 21/46; H01L 21/78

(52) U.S. Cl. .................. 438/460; 438/106; 438/108; 438/113; 438/455; 438/458; 438/460; 257/678

(58) Field of Search .................. 438/460, 106, 438/113, 107–109, 455, 458; 257/678

(56) References Cited

U.S. PATENT DOCUMENTS

| | | | |
|---|---|---|---|
| 5,837,566 A | 11/1998 | Pedersen et al. | 438/109 |
| 5,872,025 A | 2/1999 | Cronin et al. | 438/109 |
| 5,952,725 A | 9/1999 | Ball | 257/777 |
| 5,953,589 A * | 9/1999 | Shim et al. | 438/106 |
| 5,963,792 A * | 10/1999 | Wensel | 438/106 |
| 6,103,548 A * | 8/2000 | Miks et al. | 438/106 |
| 6,111,220 A * | 8/2000 | Hambree et al. | 219/209 |
| 6,133,065 A * | 10/2000 | Akram | 438/108 |
| 6,210,992 B1 * | 4/2001 | Tandy et al. | 438/106 |
| 6,238,949 B1 * | 5/2001 | Nguyen et al. | 438/106 |

OTHER PUBLICATIONS

"Tru–Si Technologies Gives New Life to Moore's Law", Tru–Si Technologies, Inc., web page online at http//www.trusi.com.

Park, Sang wook et al. "Thermal and electrical performance for wafer level package" 2000 Electronic components and technology conference 0–7803–5908 p. 301–310.*

Amagai et al. "Development of chip scale packages for center pad devices" 1997 Electronic components and technology conference 0–7803–3857 p. 343–352.*

* cited by examiner

*Primary Examiner*—Matthew Smith
*Assistant Examiner*—Granvill D Lee, Jr.
(74) *Attorney, Agent, or Firm*—Thomas Schneck; John P. McGuire, Jr.

(57) ABSTRACT

A wafer level packaging method which produces a stacked dual/multiple die integrated circuit package. In the method, the wafer with the smaller sized dice of two wafers is processed through a metal redistribution process and then solder balls are attached. The wafer is then sawed into individual die size ball-grid array packages. On the wafer with the larger sized dice, a die attached adhesive material is deposited on the front of each die site location that is intended for the attachment of one of the die-sized BGA packages. The back side of the BGA die package is placed onto the adhesive material and is cured. A wirebonding operation connects the signals from the die-size BGA package to the circuits of the bottom die. A coating material, such as epoxy, is disposed on the wafer to cover the wirebond leads and the assembly is then cured. Then, the stacked-die wafer is singulated into individual stacked-die IC packages.

18 Claims, 4 Drawing Sheets

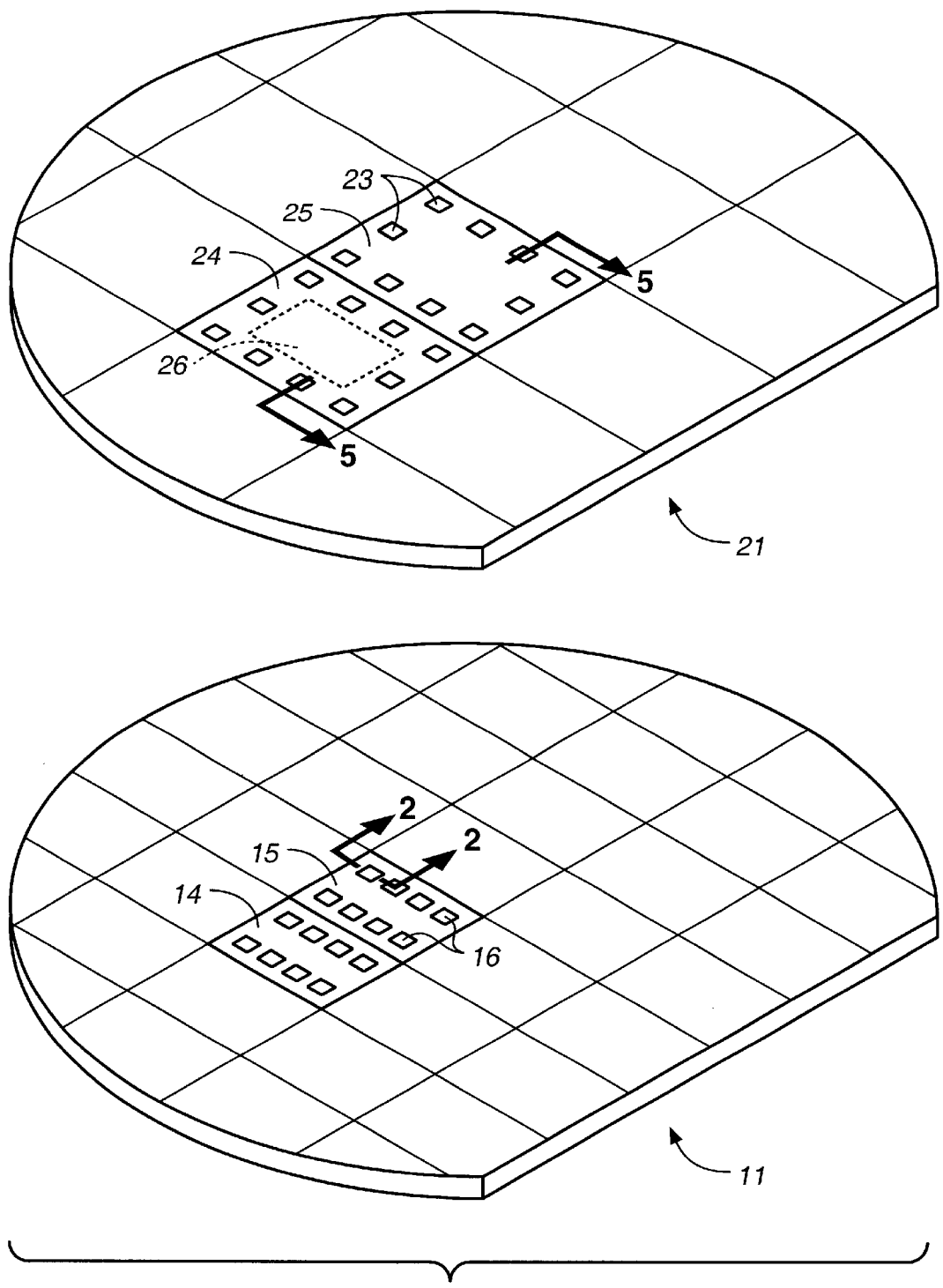
FIG._1

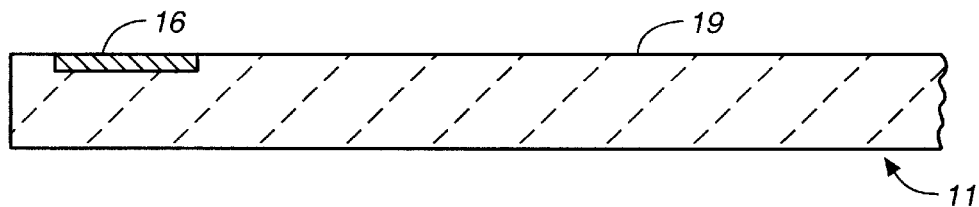
FIG._2
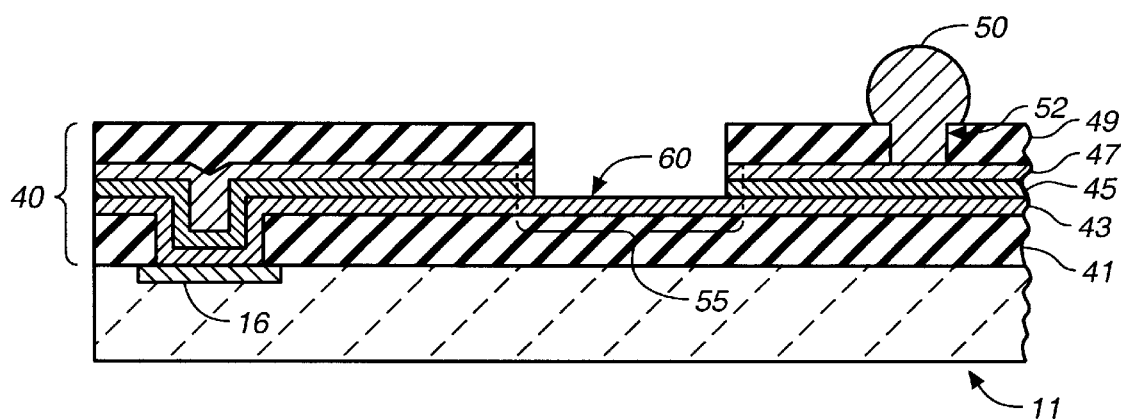
FIG._3
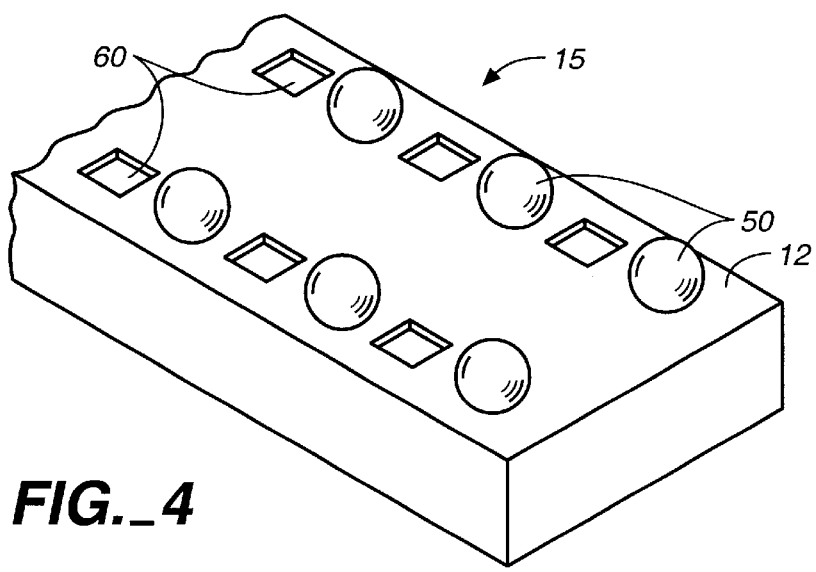
FIG._4

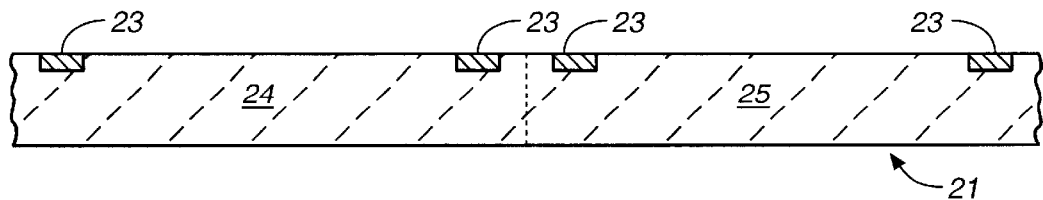
FIG._5
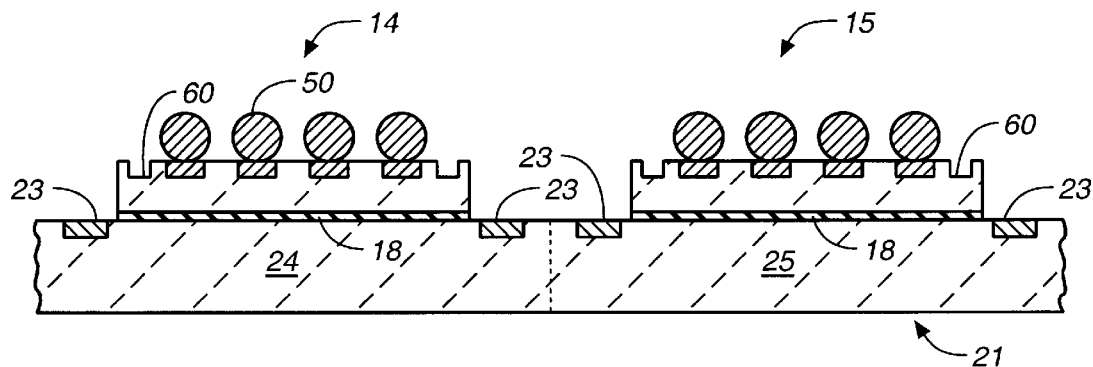
FIG._6
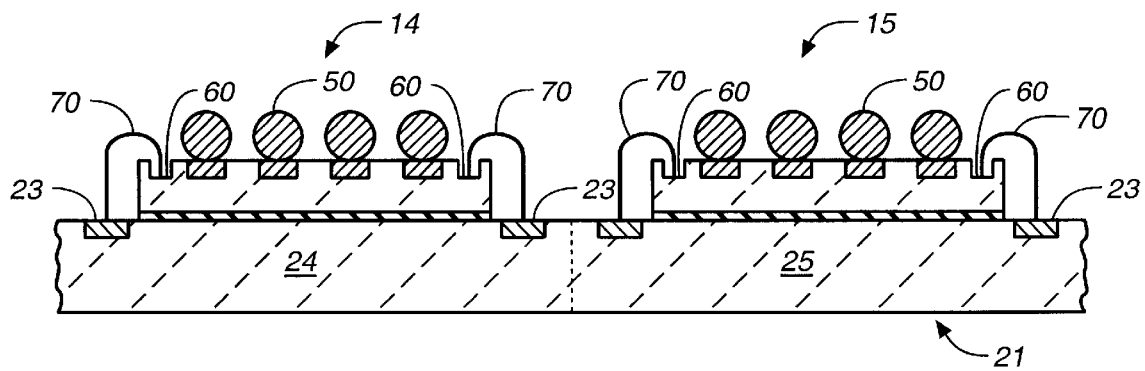
FIG._7
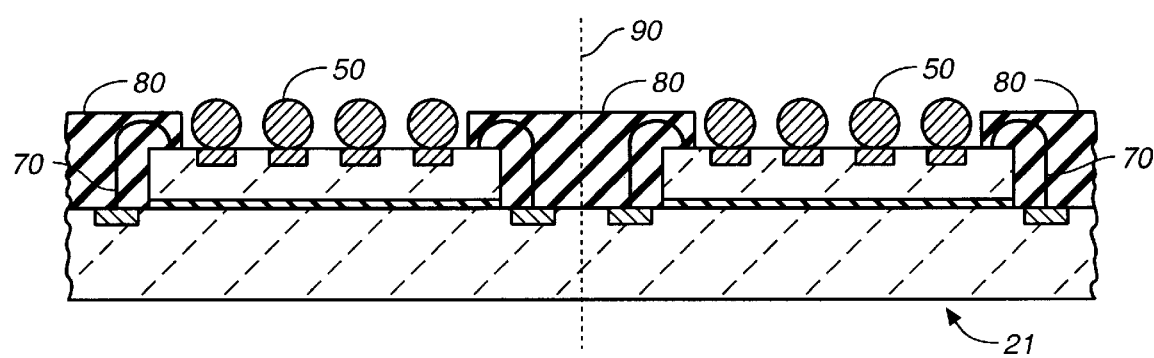
FIG._8

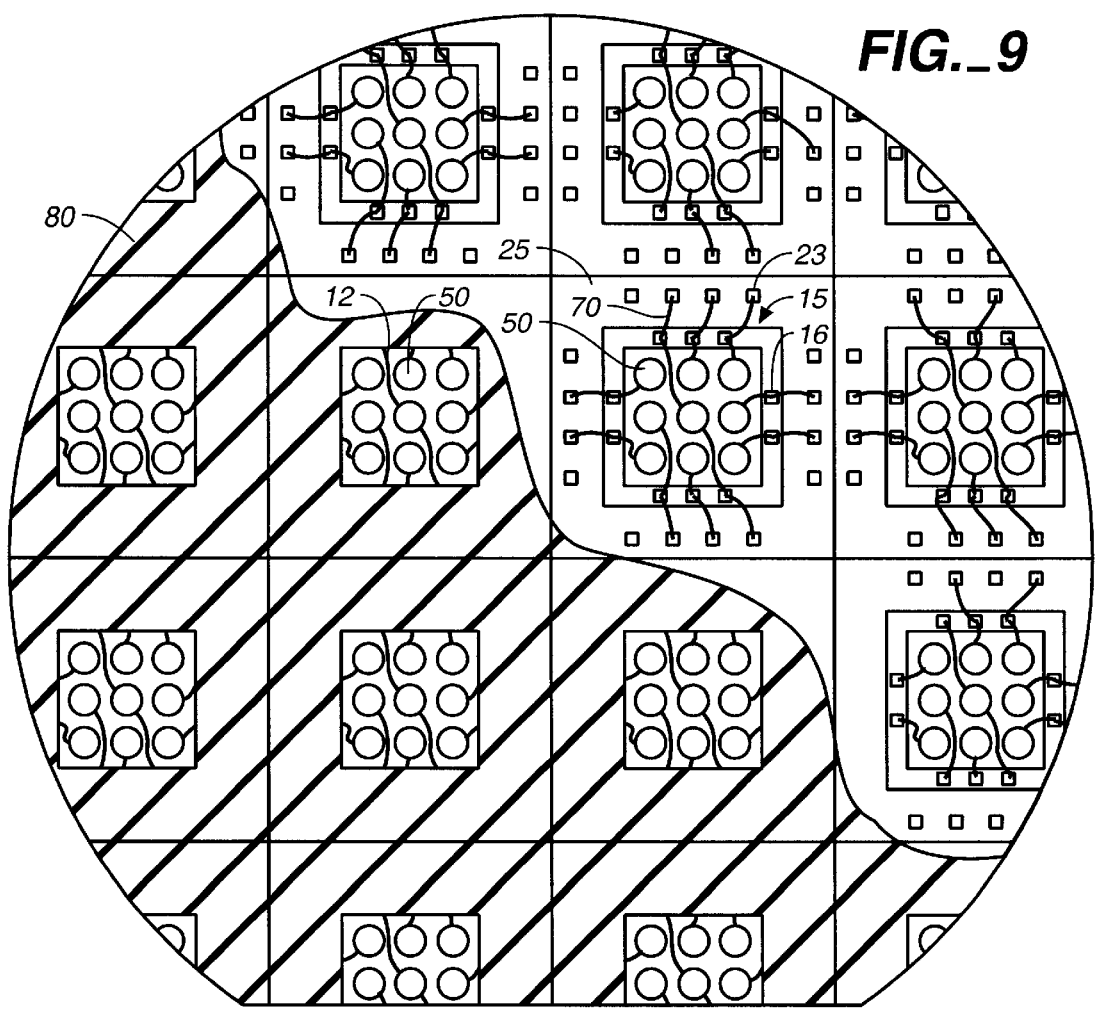
FIG._9
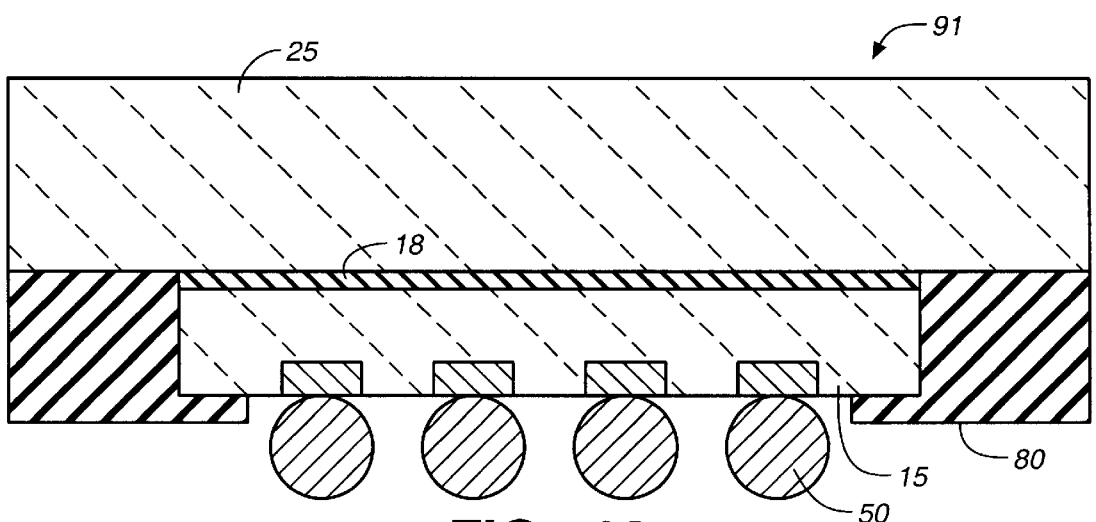
FIG._10

METHOD OF FORMING A STACKED-DIE INTEGRATED CIRCUIT CHIP PACKAGE ON A WATER LEVEL

TECHNICAL FIELD

The invention relates generally to integrated circuit chip packages, and more specifically to a method of forming a stacked-die integrated circuit package at a wafer level.

BACKGROUND ART

A chip package is used to protect integrated circuit chips from contamination and damage and is used to provide a durable and substantial electrical lead system for connecting integrated circuit chips, or dice, onto an external printed circuit board or directly into a electronic product. There are numerous advantages to providing a multi-chip integrated circuit (IC) package over single-chip carriers. By placing multiple chips directly on a substrate that provides low-inductance and low-capacitance connections between the chips and the signal/power lines, and that supplies a very dense interconnection network, packaging density and system performance can be improved. The multi-chip package minimizes the chip-to-chip spacing and reduces the inductive and capacitive discontinuities between the chips mounted on the substrate. Additionally, narrower and shorter wires on the ceramic substrate have much less capacitance and inductance than the printed circuit board interconnections. It is often advantageous to stack multiple identical IC chips into the same chip package in order to increase memory without increasing the footprint, or the area occupied on a circuit board, of the integrated circuit package.

In the prior art, it has been common to fabricate a package for each individual pair or group of dice that constitute the multi-chip package. Others have realized that it would be advantageous to be able to form the IC package at the wafer level, that is, after each individual die has been formed on the wafer, but before the wafer has been diced into individual chips. This allows for easier mass production of chip packages and for several chip packages, arranged in a matrix format on the wafer, to be manufactured and tested all at one time. This can reduce time and cost in the process of packaging and testing IC chips.

Most of the wafer level packaging schemes of the prior art involve the packaging of a single integrated circuit die. Other packaging schemes which involve multiple dice often attempt to form the semiconductor devices by stacking a plurality of wafers. For example, U.S. Pat. No 5,952,725 to Ball discloses a method for increasing circuit density by stacking an upper wafer and a lower wafer, each of which have fabricated circuitry in specific areas on their respective face surfaces. The upper wafer is attached back to back with the lower wafer, with a layer of adhesive being applied on the back side of the lower wafer. The wafers are aligned so as to bring complimentary circuitry on each of the wafers into perpendicular alignment. The adhered wafer pair is then itself attached to an adhesive film to immobilize the wafer during dicing. The adhered wafer pair may be diced into individual die pairs or wafer portions containing more than one die pair. U.S. Pat. No. 5,872,025 to Cronin et al. discloses a stacked 3-dimensional device which is prepared by stacking wafers as an alternative to stacking individual devices. The chip regions are formed on several wafers with each chip region being surrounded by an insulator filled trench. The wafers are then stacked with the chip regions in alignment and joined together by lamination. After laminating the stacks of wafers, stacks of chips are separated by etching, dicing or other processes.

One problem with methods, such as those noted above, in which whole wafers are aligned to each other, adhered together, and then diced into individual die pairs, is that there is no guarantee that all of the individual die will be "good" and function properly. For example, in aligning the wafers, a good die may be aligned with a "bad" die, or a die that doesn't function properly. A combined stacked-die package which includes both a good die and a bad die would ultimately result in a bad stacked-die package and would have to be discarded. This results in the waste of many good dice.

It is an object of the present invention to provide a method of forming a stacked-die IC package that allows all of the silicon dice on a wafer to be packaged at one time and produces an integrated circuit package that has the smallest possible footprint for a stacked-die package.

It is a further object of the present invention to provide a method of forming a stacked-die integrated circuit chip package that results in only good dice being assembled in the stacked-die package and minimizes any waste of good dice.

SUMMARY OF THE INVENTION

The above objects have been achieved by a wafer-level packaging method which allows all of the semiconductor dice on a wafer to be packaged at one time, and produces a stacked dual/multiple die integrated circuit package. The package produced is a true chip size package which has the smallest possible footprint for the stacked-die package. In the method, the wafer with the smaller sized dice of two wafers can be processed through a metal redistribution process and then solder balls are attached. The wafer is sawed into individual die-size ball-grid array packages. On the wafer with the larger sized dice, a die attached adhesive material is deposited on the front of each die site location that is intended for the attachment of one of the die-size BGA packages. The back side of the BGA die package is placed onto the adhesive material and is cured. A wirebonding operation connects the signals from the die-size BGA package to the circuits of the bottom die formed on the wafer. A coating material, such as epoxy, is disposed on the wafer to cover the wirebond leads and the assembly is then cured. The finished stacked die, while still in the wafer matrix form, facilitates easy indexing for final test or parallel testing. Then, the stacked-die wafer is singulated into individual stacked-die IC packages. The method of the present invention allows for dice with the same or different functions to be combined into a single IC package.

BRIEF DESCRIPTION OF THE DRAWINGS

FIG. 1 is a perspective view of a first and a second silicon wafer, each wafer having a plurality of dice formed on a top surface.

FIGS. 2 and 3 are cross-sectional views of a section 2—2 of the second wafer 11 shown in FIG. 1, illustrating a metal redistribution process of the second wafer.

FIG. 4 is a perspective view of one of the dice from the second wafer shown in FIG. 1 after solder balls are attached.

FIGS. 5–8 are cross-sectional views of a section 5—5 of the first wafer shown in FIG. 1, showing the various process steps used in forming an IC package using the method of the present invention.

FIG. 9 is a top view of the first wafer of FIG. 1, after completion of the process steps of FIGS. 5–8.

FIG. 10 is a cross-sectional view of a finalized IC package formed by the method of the present invention.

BEST MODE FOR CARRYING OUT THE INVENTION

With reference to FIG. 1, a first silicon wafer 21 and a second silicon wafer 11 are shown. Although silicon is the typical material, other semiconductor materials could also be used. Each of the wafers 21, 11 have a plurality of microcircuits fabricated thereon. The microcircuits are arranged into a matrix of individual chips or dice. As shown in FIG. 1, the dice 24, 25 on the first wafer 21 are larger than the dice 14, 15 on the second wafer 11. A plurality of aluminum bonding pads 23, 16, are arranged around the perimeter of each of the chips on each of the wafers 21, 11. The chips may be tested while still in wafer matrix format, to determine which chips are functioning properly, and which chips are not functioning properly.

With reference to FIG. 2, the second wafer 11 has a plurality of wirebonding pads 16 arranged around the upper surface 19. These bonding pads 16 may be used as the connection points for each of the individual die when packaged in the chip package of the present invention, or the upper surface 19 of the wafer 11 may undergo a metal redistribution process. The metal redistribution process patterns metal traces that connect to the wirebond pads, and then routes the traces to solder pads locations within each of the dice. The metallurgy of the redistribution layer should have good adhesion to the silicon die material and sufficient electrical properties for the application of the device. At the wirebonding pad connection point, the metallurgy should be wire-bondable using aluminum or gold wire. The metallurgy at the solder pad site should be suitable for a reliable solderable attach onto each of the dice.

With reference to FIG. 3, one type of metal redistribution layer is shown. This metal redistribution layer and the method of forming this type of metal redistribution layer is disclosed in U.S. Pat. application Ser. No. 09/434,711 which is assigned to the assignee of the present invention and is herein incorporated by reference. Referring to FIG. 3, a passivization layer 41 is formed over the wafer surface and a tri-metal layer structure 40 is formed over the bonding pads 16 and the passivization layer 41. The tri-metal layer structure 40 consists of a layer of aluminum 43, a layer of nickel 45 and a layer of copper 47. A second passivization layer 49 is then formed over the tri-metal layer 40. The assembly is etched such that a solder pad 52 of a copper material and a wirebonding pad 60 made of aluminum material is formed. Solder balls 50 can then be placed on the solder pads 52. The solder balls 50 may be placed on the solder pads 52 through a mechanical transfer of preformed solder balls. Alternatively, the solder balls 50 can be formed by screen or stencil printing solder paste. The solder is then reflowed to form the packaged solder balls. The solder balls 50 are applied in what ever type of pattern is desired, such as an uniform full matrix over the entire surface of the wafer.

At this point, the second wafer 11 is diced into individual chips. With reference to FIG. 4 and FIG. 1, each die 15 is of a size to be small enough such that the die 15 would fit in a space 26 on the first wafer 21, such that the die 15 would not encroach upon the bonding pads 23 of the dice 24, 25 of the first wafer 21 when the die 15 was stacked on the wafer 21. As shown in FIG. 4, a plurality of solder balls 50 and wirebonding pads 60 are arranged on a top surface 12 of the die 15.

With reference to FIG. 5, a section 5—5 of the first wafer 21 is shown with the aluminum bonding pads 23 being disposed on a top surface of the wafer 21. As noted above, the wafer 21 is arranged into a matrix of individual dice 24, 25. With reference to FIG. 6, the dice 14, 15 from the second wafer are arranged on the top surface of the first wafer 21. The dice 14, 15, being in a ball-grid array format, can be placed on the wafer 21 using a pick and place machine to provide accuracy in placing each top die ball-grid array on the bottom wafer 21. The dice 14, 15 should be arranged so that the wirebond pads 23 on each of the dice 24, 25 of the wafer 21 are exposed. To attach the dice 14, 15 to the wafer 21, an adhesive material 18 such as epoxy or thermo-plastic, in either paste form or pre-form film, is deposited on the top surface of the wafer 21. Automatic paste dispensing equipment can be used for depositing a paste material, or if the adhesive is in a preform, pick and place equipment can be used. The backside of the dice 14, 15 are placed on the adhesive material 18. The die bond adhesive is then cured.

With reference to FIG. 7, a wirebonding operation is then conducted in order to connect the signals from each of the top dice to each of the bottom dice on the wafer 21. For example, to connect upper die 15 with lower die 25, gold wirebond leads 70 are connected from the wirebond pad 60 of the top die 15 to the wirebond pads 23 of bottom die 25 on the wafer 21. This is done using standard wirebond techniques. Then, with reference to FIG. 8, a coating material, such as epoxy, is used to cover the wirebond leads 70. It is important to minimize the resultant height of this coating material in order to minimize the use of vertical space. The coating material 80 is then cured. At this point, package testing can be performed in wafer matrix form. With reference to FIG. 9, a top die 15 has been placed on top of each die 25 of wafer 21. Wirebond leads 70 are used to connect the bonding pads 16 of the upper die 15 to the bonding pads 23 of the lower die 25. The encapsulant material 80 covers all of the wirebond leads 70 but does not cover the solder balls 50 and the top surface 12 of the dice.

Referring to FIG. 10, the first wafer is then singulated, or diced, into individual chip die packages 91. A common technique for the singulation is to use a wafer saw with diamond or resinoid saw blades. Again, package testing can also be performed after the wafer is singulated into individual chip packages 91. The finished stacked-die BGA package 91 of the present invention can then be mounted on an end user's printed circuit board in the same manner as used for prior art BGA packages. The stacked-die BGA package of the present invention includes both the smaller die 15 and the larger die 25 and has the same footprint as the larger die 25, so no additional space is required due to the IC package. Additionally, because each of the dice from the second wafer are individually placed on the first wafer, as opposed to the prior art methods in which two whole wafers are stacked together, the known good dice of the second wafer can be lined up with known good dice of the first wafer in order to minimize the waste of any good dice. Additionally, the method of the present invention can also be repeated for multiple dice in order to stack more than two dice in a single IC package and, thus, increase the memory of the IC package without increasing the amount of space required to be used on a printed circuit board.

What is claimed is:

1. A method of forming a stacked-die integrated circuit chip package on a wafer level, comprising:

providing a first semiconductor wafer and a second semiconductor wafer, each of the wafers including a plurality of dice, the plurality of dice of the second wafer being of a smaller size than the plurality of dice of the first wafer, each of the plurality of dice of the first and second wafers having a plurality of bonding pads disposed on a first surface thereof, attaching a plurality of interconnects to the plurality of bonding pads of the first surface of the plurality of dice of the second wafer, dicing the second wafer into a plurality of individual dice, attaching the individual dice of the second wafer to the first wafer, wherein a back surface of an individual die is placed on and attached to the first surface of the first wafer, to form a plurality of package structures on the first wafer, connecting the plurality of bonding pads of the individual dice to the plurality of bonding pads of the plurality of dice of the first wafer, and dicing the first wafer into a plurality of individual stacked-die integrated circuit packages.

2. The method of claim 1, further comprising, before the step of attaching the plurality of interconnects to the plurality of bonding pads of the first surface of the plurality of dice of the second wafer, forming a metal redistribution layer on the first surface of the second wafer to form a plurality of wirebond pads and interconnect pads.

3. The method of claim 2 wherein the interconnects are attached to the interconnects pads on the metal redistribution layer of the second wafer.

4. The method of claim 2 wherein the plurality of wirebond pads of the individual dice are connected to the plurality of bonding pads of the first wafer.

5. The method of claim 1 wherein the step of connecting the plurality of wirebond pads of the individual dice to the plurality of bonding pads of the first wafer is made by a plurality of bonding leads.

6. The method of claim 5, further comprising, after the step of connecting the plurality of wirebond pads of the individual dice to the plurality of bonding pads of the first wafer, applying a coating material over the plurality of bonding leads.

7. The method of claim 6 wherein the coating material is epoxy.

8. The method of claim 1, further comprising, after the step of connecting the plurality of wirebond pads of the individual dice to the plurality of bonding pads of the first wafer, testing the package structures on the first wafer.

9. The method of claim 1 wherein the plurality of interconnects are a plurality of solder balls.

10. The method of claim 1 wherein the individual dice are attached to the first wafer by an adhesive material.

11. A method of forming a stacked-die integrated circuit chip package on a wafer level, comprising:

providing a first semiconductor wafer and second semiconductor wafer, each of the wafers including a plurality of dice, the plurality of dice of the second wafer being of a smaller size than the plurality of dice of the first wafer, each of the plurality of dice having a plurality of bonding pads disposed on a first surface thereof, forming a metal redistribution layer on a first surface of the second wafer to form a plurality of wirebond pads and interconnect pads, attaching a plurality of interconnects to the interconnect pads of the metal redistribution layer of the second wafer, dicing the second wafer into a plurality of individual dice, attaching the individual dice to the first wafer, wherein a back surface of an individual die is placed on and attached to the first surface of the first wafer, to form a plurality of package structures on the first wafer, connecting the plurality of wirebond pads of the individual dice to the plurality of bonding pads of the first wafer, and dicing the first wafer into a plurality of individual stacked-die integrated circuit chip packages.

12. The method of claim 11 wherein the step of connecting the plurality of wirebond pads of the individual dice to the plurality of bonding pads of the first wafer is made by a plurality of bonding leads.

13. The method of claim 12, further comprising, after the step of connecting the plurality of wirebond pads of the individual dice to the plurality of bonding pads of the first wafer, applying a coating material over the plurality of bonding leads.

14. The method of claim 13 wherein the coating material is epoxy.

15. The method of claim 11, further comprising, after the step of connecting the plurality of wirebond pads of the individual dice to the plurality of bonding pads of the first wafer, testing the package structures on the first wafer.

16. The method of claim 11 wherein the plurality of interconnects are a plurality of solder balls.

17. The method of claim 11 wherein the individual dice are attached to the first wafer by an adhesive material.

18. A method of forming a stacked-die integrated circuit chip package on a wafer level, comprising:

providing a first semiconductor wafer and second semiconductor wafer, each of the wafers including a plurality of dice, the plurality of dice of the second wafer being of a smaller size then the plurality of dice of the first wafer, each of the plurality of dice having a plurality of bonding pads disposed on a first surface thereof, forming a metal redistribution layer on a first surface of the second wafer to form a plurality of wirebond pads and interconnect pads, attaching a plurality of solder balls to the interconnect pads of the metal redistribution layer of the second wafer, dicing the second wafer into a plurality of individual dice, attaching the individual dice to the first wafer, wherein a back surface of an individual die is placed on and attached to the first surface of the first wafer, to form a plurality of package structures on the first wafer, using a plurality of bonding leads to connect the plurality of wirebond pads of the individual dice to the plurality of bonding pads of the first wafer, applying a coating material over the plurality of bonding leads, testing the package structures on the first wafer, and dicing the first wafer into a plurality of individual stacked-die integrated circuit chip packages.

* * * * *

UNITED STATES PATENT AND TRADEMARK OFFICE
CERTIFICATE OF CORRECTION

PATENT NO.     : 6,344,401 B1
DATED          : February 5, 2002
INVENTOR(S)    : Ken M. Lam It is certified that error appears in the above-identified patent and that said Letters Patent is hereby corrected as shown below:

<u>Title page,</u>
Item [54], "METHOD OF FORMING A STACKED-DIE INTEGRATED CIRCUIT CHIP PACKAGE ON A WATER LEVEL" should read
-- METHOD OF FORMING A STACKED-DIE INTEGRATED CIRCUIT CHIP PACKAGE ON A WAFER LEVEL --

Signed and Sealed this

Fifteenth Day of October, 2002

*Attest:*

JAMES E. ROGAN
*Attesting Officer*  *Director of the United States Patent and Trademark Office*